United States Patent
Yeh et al.

(10) Patent No.: US 10,833,155 B2
(45) Date of Patent: Nov. 10, 2020

(54) VERTICAL FIELD EFFECT TRANSISTOR WITH TOP AND BOTTOM AIRGAP SPACERS

(71) Applicant: International Business Machines Corporation, Armonk, NY (US)

(72) Inventors: Chun-Chen Yeh, Danbury, CT (US); Veeraraghavan S. Basker, Schenectady, NY (US); Junli Wang, Slingerlands, NY (US); Alexander Reznicek, Troy, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 16/356,512

(22) Filed: Mar. 18, 2019

(65) Prior Publication Data

US 2020/0303497 A1    Sep. 24, 2020

(51) Int. Cl.
| | |
|---|---|
| *H01L 29/06* | (2006.01) |
| *H01L 29/66* | (2006.01) |
| *H01L 21/768* | (2006.01) |
| *H01L 21/764* | (2006.01) |
| *H01L 21/8238* | (2006.01) |
| *H01L 29/78* | (2006.01) |
| *H01L 29/423* | (2006.01) |
| *H01L 27/092* | (2006.01) |
| *H01L 21/762* | (2006.01) |

(52) U.S. Cl.
CPC ........ *H01L 29/0649* (2013.01); *H01L 21/764* (2013.01); *H01L 21/7682* (2013.01); *H01L 21/76224* (2013.01); *H01L 21/76802* (2013.01); *H01L 21/823864* (2013.01); *H01L 21/823878* (2013.01); *H01L 21/823885* (2013.01); *H01L 27/0922* (2013.01); *H01L 29/42356* (2013.01); *H01L 29/6653* (2013.01); *H01L 29/66666* (2013.01); *H01L 29/7827* (2013.01)

(58) Field of Classification Search
CPC ............. H01L 29/0649; H01L 29/7827; H01L 21/7682; H01L 21/764; H01L 21/76802; H01L 21/76289
See application file for complete search history.

(56) References Cited

U.S. PATENT DOCUMENTS

| | | | |
|---|---|---|---|
| 9,443,982 B1 * | 9/2016 | Balakrishnan | .... H01L 29/66742 |
| 9,748,380 B1 | 8/2017 | Lie et al. | |
| 9,859,166 B1 | 1/2018 | Cheng et al. | |
| 10,014,370 B1 * | 7/2018 | Xie | ...... H01L 29/0653 |
| 2001/0045608 A1 * | 11/2001 | Tseng | .................. H01L 29/4983 |
| | | | 257/410 |
| 2018/0350939 A1 | 12/2018 | Basker et al. | |

OTHER PUBLICATIONS

Anonymous, "Method for Fabricating a Vertical FET with Air-Gap Top Spacer", IPCOM000245671D, Mar. 28, 2016, 6 pages.

* cited by examiner

*Primary Examiner* — Hsien Ming Lee
(74) *Attorney, Agent, or Firm* — Scully, Scott, Murphy & Presser, P.C.; L. Jeffrey Kelly, Esq.

(57) ABSTRACT

A vertical field effect transistor (VFET) having a bottom airgap spacer located beneath a gate structure and a top airgap spacer located above the gate structure is provided. The top airgap spacer reduces overlap capacitance between the gate structure and a top source/drain structure of the VFET, while the bottom airgap spacer reduces the overlap capacitance and a coupling capacitance that is present between the gate structure and a bottom source/drain structure of the VFET.

11 Claims, 9 Drawing Sheets

VERTICAL FIELD EFFECT TRANSISTOR WITH TOP AND BOTTOM AIRGAP SPACERS

BACKGROUND

The present application relates to a semiconductor structure and a method of forming the same. More particularly, the present application relates to a vertical field effect transistor (VFET) having a bottom airgap spacer and a top airgap spacer and a method of forming the same.

Conventional VFETs are devices where the source-drain current flows in a direction normal to the substrate surface. In such devices, a vertical semiconductor pillar (or fin) defines the channel with the source and drain located at opposing ends of the semiconductor pillar. VFETs are an attractive option for technology scaling for 7 nm beyond technologies, and have potential advantages over conventional FinFETs in terms of density, performance, power consumption and integration.

VFETs have an inherent overlap capacitance plus a coupling capacitance that is present between the vertical gate structure and the bottom source/drain structure; overlap capacitance is also present between the vertical gate structure and the top source/drain structure. This combination of overlap capacitance and coupling capacitance that is present between the vertical gate structure and the bottom source/drain structure may compromise the device performance and any area scaling benefits that may be attributed to VFETs.

SUMMARY

A vertical field effect transistor (VFET) having a bottom airgap spacer located beneath a gate structure and a top airgap spacer located above the gate structure is provided. The top airgap spacer reduces overlap capacitance between the gate structure and a top source/drain structure of the VFET, while the bottom airgap spacer reduces the overlap capacitance and a coupling capacitance that is present between the gate structure and a bottom source/drain structure of the VFET.

In one aspect of the present application, a semiconductor structure (i.e., VFET) is provided. In one embodiment, the semiconductor structure includes at least one vertical semiconductor material structure having a bottommost surface contacting a surface of a bottom source/drain structure and a topmost surface contacting a surface of a top source/drain structure. A gate structure is located laterally adjacent to a sidewall of the at least one vertical semiconductor material structure. A bottom airgap spacer is located between the gate structure and the bottom source/drain structure and contacts a lower portion of the sidewall of the at least one vertical semiconductor material structure. A top airgap spacer is located above the gate structure and contacts an upper portion of the sidewall of the at least one vertical semiconductor material structure.

In another aspect of the present application, a method of forming a semiconductor structure (i.e., VFET) is provided. In one embodiment, the method includes forming a vertical semiconductor material structure extending upwards from a bottom source/drain structure. A bottom sacrificial spacer is present on the bottom source/drain structure and contacts a lower portion of a sidewall of the vertical semiconductor material structure, and a gate structure is located on the bottom sacrificial spacer and contacting the sidewall of the vertical semiconductor material structure. Next, a passivation liner is formed that encapsulates the gate structure and is present on physically exposed surfaces of the vertical semiconductor material structure and the bottom sacrificial spacer. A lower interlayer dielectric (ILD) material is formed that laterally surrounds the vertical semiconductor material structure and the gate structure and is adjacent to the passivation liner. Openings are then formed into the lower ILD material that access the passivation liner and the bottom sacrificial spacer. The bottom sacrificial spacer and the passivation liner that are physically exposed by the openings are then removed to provide a bottom airgap opening located beneath the gate structure and a top airgap opening located above the gate structure. Each opening is then filled with a dielectric fill material which seals the bottom airgap opening and the top airgap opening providing a bottom airgap spacer, and a top airgap spacer, respectively. A top source/drain structure is formed on a topmost surface of the vertical semiconductor material structure.

DETAILED DESCRIPTION

Figure 2:
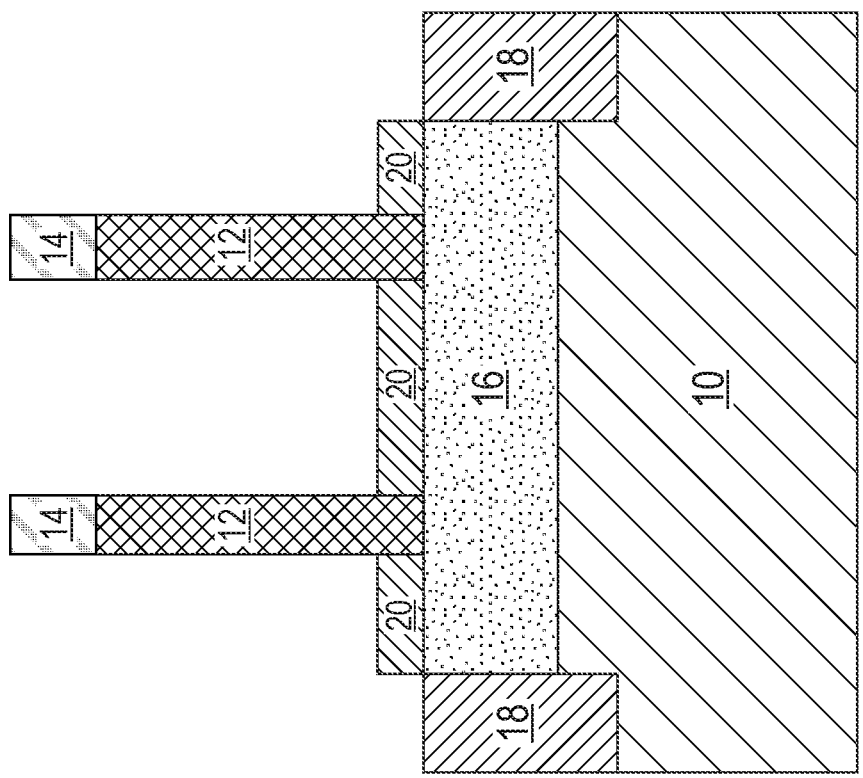
FIG. 2 is a cross sectional view of the exemplary semiconductor structure of FIG. 1 after forming a bottom source/drain (S/D) structure and a bottom sacrificial spacer.

The present application will now be described in greater detail by referring to the following discussion and drawings that accompany the present application. It is noted that the drawings of the present application are provided for illustrative purposes only and, as such, the drawings are not drawn to scale. It is also noted that like and corresponding elements are referred to by like reference numerals.

In the following description, numerous specific details are set forth, such as particular structures, components, materials, dimensions, processing steps and techniques, in order to provide an understanding of the various embodiments of the present application. However, it will be appreciated by one of ordinary skill in the art that the various embodiments of the present application may be practiced without these specific details. In other instances, well-known structures or processing steps have not been described in detail in order to avoid obscuring the present application.

It will be understood that when an element as a layer, region or substrate is referred to as being "on" or "over" another element, it can be directly on the other element or intervening elements may also be present. In contrast, when an element is referred to as being "directly on" or "directly over" another element, there are no intervening elements present. It will also be understood that when an element is referred to as being "beneath" or "under" another element, it can be directly beneath or under the other element, or intervening elements may be present. In contrast, when an element is referred to as being "directly beneath" or "directly under" another element, there are no intervening elements present.

Figure 1:
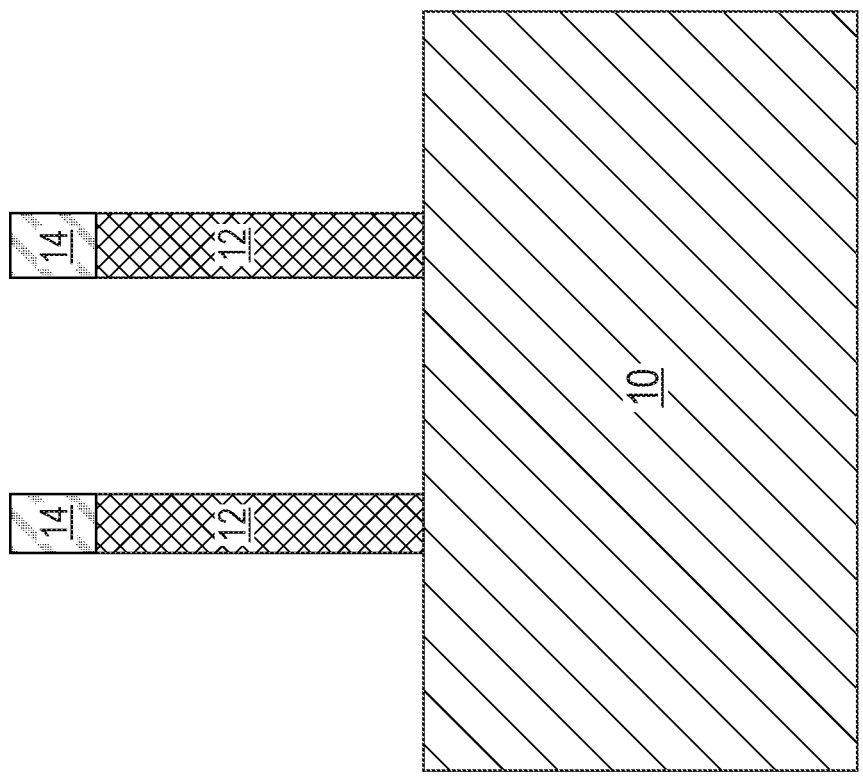
FIG. 1 is a cross sectional view of an exemplary semiconductor structure including a vertical semiconductor material structure extending upwards from a surface of a semiconductor substrate, wherein the vertical semiconductor material structure includes a dielectric hard mask cap located on a topmost surface thereof.

Referring first to FIG. 1, there is illustrated an exemplary semiconductor structure including a vertical semiconductor material structure 12 extending upwards from a surface of a semiconductor substrate 10, wherein the vertical semiconductor material structure 12 includes a dielectric hard mask cap 14 located on a topmost surface thereof. In FIG. 1, and by way of one example, two vertical semiconductor material structures 12 are shown. In some embodiments, a single vertical semiconductor material structure 12 or more than two vertical semiconductor material structures 12 can be present on the surface of semiconductor substrate 10. Each vertical semiconductor material structure serves as a vertical channel material of a VFET.

In one embodiment, each vertical semiconductor material structure 12 is a semiconductor fin. As used herein, a "semiconductor fin" refers to a semiconductor structure including a pair of vertical sidewalls that are parallel to each other. As used herein, a surface is "vertical" if there exists a vertical plane from which the surface does not deviate by more than three times the root mean square roughness of the surface. In such an embodiment, each semiconductor fin can have a height from 15 nm to 100 nm, a length from 20 nm to 50 nm, and a width from 3 nm to 15 nm. Other semiconductor fin heights and/or widths that are lesser than, or greater than, the ranges mentioned herein can also be used in the present application. Each semiconductor fin is spaced apart from its nearest neighboring semiconductor fin by a pitch of from 20 nm to 100 nm; the pitch is measured from one point of one semiconductor fin to the exact point on a neighboring semiconductor fin. Also, each semiconductor fin is oriented parallel to each other. An opening or gap is present between each neighboring pair of semiconductor fins.

In another embodiment, each vertical semiconductor material structure 12 is a semiconductor pillar. As used herein, a "semiconductor pillar" refers to a semiconductor structure which is similar (in terms of height and width) to a semiconductor fin except that the length of the semiconductor pillar is much less than the length of a semiconductor fin. In one embodiment, the length of the semiconductor pillar is from 3 nm to 15 nm.

The semiconductor substrate 10 can be composed of a remaining portion of a base semiconductor substrate (not shown). The semiconductor substrate 10 can be composed of one or more semiconductor materials having semiconducting properties. Examples of semiconductor materials that can provide the semiconductor substrate 10 include silicon (Si), germanium (Ge), silicon germanium alloys (SiGe), silicon carbide (SiC), silicon germanium carbide (SiGeC), III-V compound semiconductors or II-VI compound semiconductors. III-V compound semiconductors are materials that include at least one element from Group III of the Periodic Table of Elements and at least one element from Group V of the Periodic Table of Elements. II-VI compound semiconductors are materials that include at least one element from Group II of the Periodic Table of Elements and at least one element from Group VI of the Periodic Table of Elements.

Each vertical semiconductor material structure 12 can be composed of one of the semiconductor materials mentioned above for the semiconductor substrate 10. In one embodiment, the semiconductor material structures 12 and the semiconductor substrate 10 are composed entirely of a same semiconductor material. In such an embodiment, no material interface is present between the vertical semiconductor material structures 12 and the semiconductor substrate 10. In one example, the vertical semiconductor material structures 12 and the semiconductor substrate 10 are composed entirely of silicon. In another embodiment, the vertical semiconductor material structures 12 are composed of a different semiconductor material than the semiconductor substrate 10. In such an embodiment, a material interface would exist between the bottommost surface of each vertical semiconductor material structure 12 and the topmost surface of the semiconductor substrate 10. In one example, the vertical semiconductor material structures 12 are composed of a silicon germanium alloy or a III-V compound semiconductor, while the semiconductor substrate 10 is composed of silicon.

Each dielectric hard mask cap 14 is composed of a dielectric hard mask material such as, for example, silicon dioxide, silicon nitride and/or silicon oxynitride. In one example, silicon nitride is employed as the dielectric hard mask material of each dielectric hard mask cap 14. As is shown, the dielectric hard mask cap 14 has sidewall surfaces that are vertically aligned to sidewall surfaces of one of the underlying vertical semiconductor material structures 12.

The exemplary semiconductor structure of FIG. 1 can be formed by first providing a dielectric hard mask layer (not shown) onto a surface of a base semiconductor substrate (not shown). The base semiconductor substrate is typically a bulk semiconductor substrate. By "bulk" it is meant that the base semiconductor substrate is entirely composed of at least one semiconductor material having semiconducting properties. The base semiconductor substrate can include at least one of the semiconductor materials mentioned above for semiconductor substrate 10, and the hard mask layer can include one of the dielectric hard mask materials mentioned above for the dielectric hard mask caps 14.

The dielectric hard mask layer can be formed utilizing a deposition process such as, for example, chemical vapor deposition (CVD) or plasma enhanced chemical vapor deposition (PECVD). In some embodiments, the dielectric hard mask layer can be formed by a thermal growth process such as, for example, thermal oxidation and/or thermal nitridation. In yet other embodiments, the dielectric hard mask layer can be formed utilizing a combination of, and in any order, a deposition process and a thermal growth process. The dielectric hard mask layer is a continuous layer (without any breaks or gaps) whose thickness can be from 20 nm to 100 nm. Other thicknesses that are lesser than, or greater than the aforementioned thicknesses values can also be employed as the thickness of the dielectric hard mask layer.

The dielectric hard mask layer and an upper semiconductor material portion of the base semiconductor substrate are then patterned to provide the exemplary semiconductor structure shown in FIG. 1. In one embodiment, the patterning of the dielectric hard mask layer and the upper semiconductor material portion of the base semiconductor substrate can include lithography and etching. The lithographic process includes forming a photoresist (not shown) atop a material or material stack to be patterned, exposing the photoresist to a desired pattern of radiation, and developing the exposed photoresist utilizing a conventional resist developer. The photoresist can be a positive-tone photoresist, a negative-tone photoresist or a hybrid-tone photoresist. The etching process (i.e., pattern transfer etch) includes a dry etching process (such as, for example, reactive ion etching, ion beam etching, plasma etching or laser ablation), and/or a wet chemical etching process. In some embodiments, the patterned photoresist is removed from the structure immediately after the pattern has been transferred into the dielectric hard mask layer. In other embodiments, the patterned photoresist is removed from the structure after the pattern has been transferred into both the dielectric hard mask layer and the upper semiconductor material portion of the base semiconductor substrate. In either embodiment, the patterned photoresist can be removed utilizing a conventional photoresist stripping process such as, for example, ashing.

In another embodiment, the patterning of the dielectric hard mask layer and the upper semiconductor material portion of the base semiconductor substrate can include a sidewall image transfer (SIT) process. The SIT process includes forming a mandrel material layer (not shown) atop the material or material layers that are to be patterned. The mandrel material layer (not shown) can include any material (semiconductor, dielectric or conductive) that can be selectively removed from the structure during a subsequently performed etching process. In one embodiment, the mandrel material layer (not shown) can be composed of amorphous silicon or polysilicon. In another embodiment, the mandrel material layer (not shown) can be composed of a metal such as, for example, Al, W, or Cu. The mandrel material layer (not shown) can be formed, for example, by chemical vapor deposition or plasma enhanced chemical vapor deposition. Following deposition of the mandrel material layer (not shown), the mandrel material layer (not shown) can be patterned by lithography and etching to form a plurality of mandrel structures (also not shown) on the topmost surface of the structure.

The SIT process continues by forming a spacer (not shown) on each sidewall of each mandrel structure. The spacer can be formed by deposition of a spacer material and then etching the deposited spacer material. The spacer material can comprise any material having an etch selectivity that differs from the mandrel material. Examples of deposition processes that can be used in providing the spacer material include, for example, chemical vapor deposition (CVD), plasma enhanced chemical vapor deposition (PECVD), or atomic layer deposition (ALD). Examples of etching that be used in providing the spacers include any etching process such as, for example, reactive ion etching.

After formation of the spacers, the SIT process continues by removing each mandrel structure. Each mandrel structure can be removed by an etching process that is selective for removing the mandrel material. Following the mandrel structure removal, the SIT process continues by transferring the pattern provided by the spacers into the underlying material or material layers. The pattern transfer may be achieved by utilizing at least one etching process. Examples of etching processes that can used to transfer the pattern may include dry etching (i.e., reactive ion etching, plasma etching, and ion beam etching or laser ablation) and/or a chemical wet etch process. In one example, the etch process used to transfer the pattern may include one or more reactive ion etching steps. Upon completion of the pattern transfer, the SIT process concludes by removing the spacers from the structure. Each spacer may be removed by etching or a planarization process.

In yet a further embodiment, the patterning of the dielectric hard mask layer and the upper semiconductor material portion of the base semiconductor substrate can include a direct self-assembly (DSA) process in which a copolymer that is capable of direct self-assembly is used. Other well known patterning process can also be used in forming the vertical semiconductor material structures 12.

Referring now to FIG. 2, there is illustrated the exemplary semiconductor structure of FIG. 1 after forming a bottom source/drain (S/D) structure 16 and a bottom sacrificial spacer 20. An isolation structure 18 may be formed in the semiconductor substrate 10 to define an active device area. In one embodiment, the active device area can be an nFET device area. In another embodiment, the active device area can be a pFET device area. In some embodiments, another device area can be located laterally adjacent to the device area illustrated in FIG. 1. In such an embodiment, one of the device areas can be an nFET device area and the laterally adjacent device area can be a pFET device area.

The bottom S/D structure 16, the bottom sacrificial spacer 20, and the isolation structure 18 can be formed utilizing techniques that are well-known to those skilled in the art. In one example, the bottom S/D structure 16, the bottom sacrificial spacer 20, and the isolation structure 18 can be formed by first forming a sacrificial liner (not shown) on each physically exposed sidewall of each dielectric hard mask capped vertical semiconductor material structure (14/12). The sacrificial liner is composed of a dielectric material such as, for example, silicon dioxide, silicon nitride, or silicon oxynitride. In some embodiments, the dielectric material that provides the sacrificial liner is compositionally different from the dielectric hard mask material that provides each dielectric hard mask cap 14. In other embodiments, the dielectric material that provides the sacrificial liner is compositionally the same as the dielectric hard mask material that provides each dielectric hard mask cap 14. The sacrificial liner can be formed by depositing a dielectric material and then subjecting the dielectric material to an anisotropic etch such as, for example, reactive ion etching, that is selective in removing the dielectric material that provides the sacrificial liner from all horizontal surfaces of the exemplary structure shown in FIG. 1. When the sacrificial liner and the dielectric hard mask cap 14 are composed of a compositionally same dielectric material, then an upper portion of the dielectric hard mask cap 14 can be removed during the anisotropic etch employed in forming the sacrificial liner. The dielectric material that provides the sacrificial liner can be deposited by, for example, chemical vapor deposition (CVD) or plasma enhanced chemical vapor deposition (PECVD). The sacrificial liner can have a width, as measured from one sidewall to an opposing sidewall, from 2 nm to 10 nm; although other widths are possible and are not excluded from being used as width of the sacrificial liner.

Next, a bottom S/D region (not shown) is formed at the footprint of each semiconductor material structure 12 and laterally adjacent to, and contacting, a mesa portion (not shown) of the semiconductor substrate 10. In one embodiment, the bottom S/D region (not shown) can be formed utilizing an angled ion implantation process in which an n-type dopant or a p-type dopant, as defined herein below, are introduced into the semiconductor substrate 10. In such a process, a block mask can be used to protect one device region, while processing the other device region to include the bottom S/D region. The block mask is removed, and then another block mask is formed over the processed device region, while the non-processed device region is processed to include the other bottom S/D region.

In another embodiment, the bottom S/D region (not shown) can be formed by forming a trench at the footprint of each vertical semiconductor material structure 12, and then epitaxially filling the trenches with a doped semiconductor material. The doped semiconductor material may be an n-type doped semiconductor material or a p-type doped semiconductor material. When multiple device regions are formed, a block mask can be used to protect one device region, while processing the other device region to include the bottom S/D region. The block mask is removed, and then another block mask is formed over the processed device region, while the non-processed device region is processed to include the other bottom S/D region.

In the present application, the terms "epitaxially growing and/or depositing" and "epitaxially grown and/or deposited" mean the growth of a semiconductor material on a deposition surface of a semiconductor material, in which the semiconductor material being grown has the same crystalline characteristics as the semiconductor material of the deposition surface. In an epitaxial growth process, the chemical reactants provided by the source gases are controlled and the system parameters are set so that the depositing atoms arrive at the deposition surface of the semiconductor substrate with sufficient energy to move around on the surface and orient themselves to the crystal arrangement of the atoms of the deposition surface. Therefore, an epitaxial semiconductor material has the same crystalline characteristics as the deposition surface on which it is formed. Examples of various epitaxial growth process apparatuses that can be employed in the present application include, e.g., rapid thermal chemical vapor deposition (RTCVD), low-energy plasma deposition (LEPD), ultra-high vacuum chemical vapor deposition (UHVCVD), atmospheric pressure chemical vapor deposition (APCVD) and molecular beam epitaxy (MBE). The epitaxial growth can be performed at a temperature of from 300° C. to 800° C. The epitaxial growth can be performed utilizing any well known precursor gas or gas mixture. Carrier gases like hydrogen, nitrogen, helium and argon can be used. A dopant (n-type or p-type, as defined below) is typically added to the precursor gas or gas mixture.

The semiconductor material that can be epitaxially deposited in this embodiment includes, but is not limited to, silicon (Si), germanium (Ge), silicon germanium alloys (SiGe), silicon carbide (SiC), silicon germanium carbide (SiGeC), III-V compound semiconductors or II-VI compound semiconductors. In some embodiments, the semiconductor material that can be epitaxially deposited in this embodiment is composed of silicon. The semiconductor material that can be epitaxially deposited in this embodiment can be compositionally the same as, or compositionally different from, each of the vertical semiconductor material structures 12 and/or semiconductor substrate 10.

The term "n-type" refers to the addition of impurities that contributes free electrons to an intrinsic semiconductor. In a silicon containing semiconductor material, examples of n-type dopants, i.e., impurities, include, but are not limited to, antimony, arsenic and phosphorous. The concentration of n-type dopant within the semiconductor material that provides the bottom S/D region can range from $1\times10^{18}$ atoms/cm$^3$ to $1\times10^{21}$ atoms/cm$^3$, although dopant concentrations greater than $1\times10^{21}$ atoms/cm$^3$ or less than $1\times10^{18}$ atoms/cm$^3$ are also conceived.

The term "p-type" refers to the addition of impurities to an intrinsic semiconductor that creates deficiencies of valence electrons. In a silicon-containing semiconductor material, examples of p-type dopants, i.e., impurities, include, but are not limited to, boron, aluminum, gallium and indium. The concentration of p-type dopant within the semiconductor material that provides the bottom S/D region can range from $1\times10^{18}$ atoms/cm$^3$ to $1\times10^{21}$ atoms/cm$^3$, although dopant concentrations greater than $1\times10^{21}$ atoms/cm$^3$ or less than $1\times10^{18}$ atoms/cm$^3$ are also conceived.

In some embodiments, isolation structure 18 can be formed. The isolation structure 18 can be formed by forming a trench opening in the semiconductor substrate 10, and then filling the trench opening with a trench dielectric material such as, for example, silicon dioxide. A recess etch may follow the trench filling step. The isolation structure 18 can be formed either prior to or after forming the bottom S/D region.

The sacrificial liner can now be removed from each vertical semiconductor material structure 12. The sacrificial liner can be removed from each vertical semiconductor material structure 12 utilizing an etching process that is selective in removing the sacrificial liner. A portion of each dielectric hard mask 14 may, or may not, be removed during the sacrificial liner removal.

The bottom sacrificial spacer 20 can now be formed. The bottom sacrificial spacer 20 has a sidewall that directly contacts a lower portion of a sidewall of each of the vertical semiconductor material structures 12. The bottom sacrificial spacer 20 can be composed of any dielectric spacer material including, for example, silicon dioxide, silicon nitride, or silicon oxynitride. The bottom sacrificial spacer 20 can be formed utilizing a deposition process such as, for example, chemical vapor deposition or plasma enhanced chemical vapor deposition. In some instances, an etch back process may follow the deposition of the dielectric spacer material that provides the bottom sacrificial spacer 20. The bottom sacrificial spacer 20 can have a thickness from 5 nm to 15 nm. Other thicknesses that are lesser than, or greater than, the aforementioned thickness range can also be employed in the present application as the thickness of the bottom sacrificial spacer 20 as long as the height of the bottom sacrificial spacer 20 is not greater than the height of the vertical semiconductor material structures 12.

A drive-in anneal can now be performed to provide the bottom S/D structure 16. The drive-in anneal causes diffusion of dopants (n-type or p-type) from the bottom S/D region into the mesa portion of the semiconductor substrate 10. In some embodiments, the drive-anneal may be formed prior to forming the bottom sacrificial spacer 20, or any other time after formation of the bottom S/D region. Diffusion of dopants (n-type or p-type) into the semiconductor substrate 10 that is located beneath the bottom S/D region also occurs during this drive-in anneal. The drive-in anneal can be performed at a temperature from 850° C. or greater. In one example, the drive-in anneal is performed at a temperature from 950° C. to 1050° C. The drive-in anneal can include laser annealing, flash annealing, rapid thermal annealing (RTA) or any suitable combination thereof.

In some embodiments, and when present in an nFET device region, the bottom S/D structure 16 may be a bottom nFET S/D structure composed of a semiconductor material as defined above and an n-type dopant as defined above. In other embodiments, and when present in a pFET device region, the bottom S/D structure 16 may be a bottom pFET S/D structure composed of a semiconductor material as defined above and a p-type dopant as defined above.

After forming the bottom S/D structure 16, and as is shown in FIG. 2, the vertical semiconductor material structures 12 extends upward from the bottom S/D structure 16.

Figure 3:
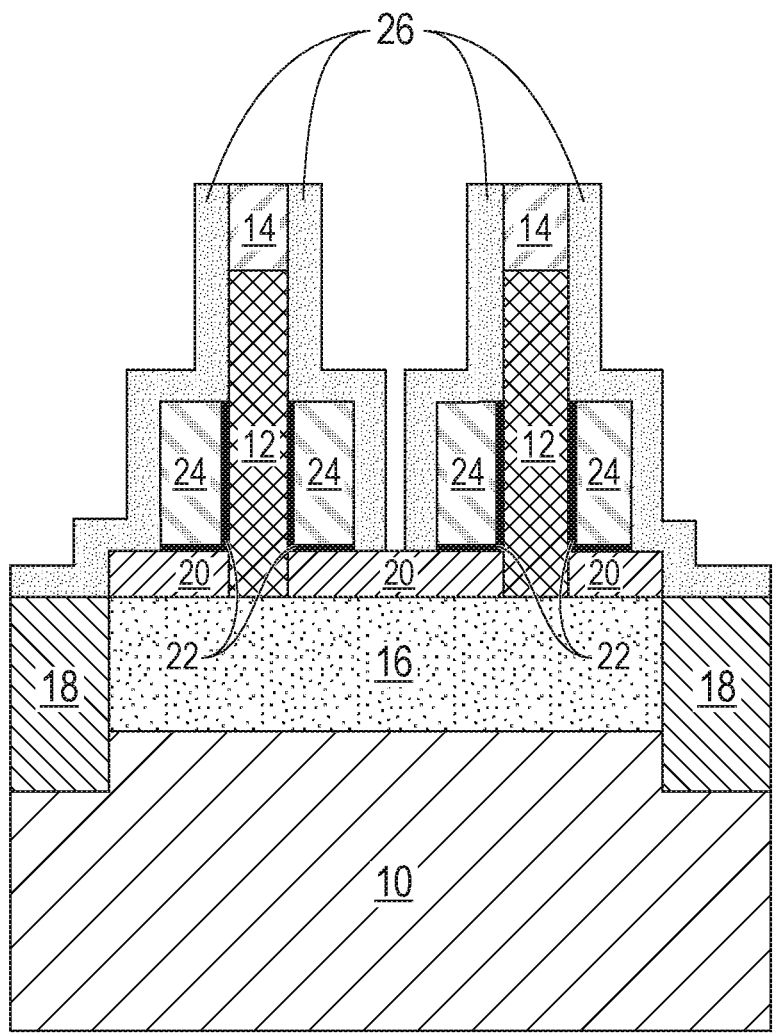
FIG. 3 is a cross sectional view of the exemplary semiconductor structure of FIG. 2 after forming a gate structure on the bottom sacrificial spacer and contacting a sidewall of the vertical semiconductor material structure, and forming a passivation liner that encapsulates the gate structure.

Referring now to FIG. 3, there is illustrated the exemplary semiconductor structure of FIG. 2 after forming a gate structure (22, 24) on the bottom sacrificial spacer 20 and contacting a sidewall of the vertical semiconductor material structure 12, and forming a passivation liner 26 that encapsulates the gate structure (22, 24). The gate structure includes a high-k gate dielectric material 22, and a work function metal 24 (as a gate electrode).

The term "high-k gate dielectric material" denotes a gate dielectric material having a dielectric constant greater than 4.0; all dielectric constants mentioned herein are measured in a vacuum. Exemplary high-k dielectrics include, but are not limited to, $HfO_2$, $ZrO_2$, $La_2O_3$, $Al_2O_3$, $TiO_2$, $SrTiO_3$, $LaAlO_3$, $Y_2O_3$, $HfO_xN_y$, $ZrO_xN_y$, $La_2O_xN_y$, $Al_2O_xN_y$, $TiO_xN_y$, $SrTiO_xN_y$, $LaAlO_xN_y$, $Y_2O_xN_y$, SiON, $SiN_x$, a silicate thereof, and an alloy thereof. Each value of x is independently from 0.5 to 3 and each value of y is independently from 0 to 2. The high-k gate dielectric material 22 can be formed by any deposition process including, for example, chemical vapor deposition (CVD), plasma enhanced chemical vapor deposition (PECVD), physical vapor deposition (PVD), sputtering, or atomic layer deposition (ALD). In one embodiment of the present application, the high-k gate dielectric material 22 can have a thickness in a range from 1 nm to 10 nm. Other thicknesses that are lesser than, or greater than, the aforementioned thickness range can also be employed for high-k gate dielectric material 22. The high-k gate dielectric material 22 typically has a conformal thickness. The term "conformal" denotes that a material layer has a vertical thickness along horizontal surfaces that is substantially the same (i.e., within ±5%) as the lateral thickness along vertical surfaces.

In some embodiments (not shown), an interfacial dielectric material can be formed prior to forming the high-k gate dielectric material 22. When present, the interfacial dielectric material is composed of silicon dioxide. The interfacial dielectric material can be formed utilizing a thermal oxidation (i.e., growth) process. The interfacial dielectric material can have a thickness from 0.5 nm to 2.0 nm.

In some embodiments, and when the gate structure is present in an nFET device region, the gate structure is an nFET gate structure and the work function metal 24 is an n-type work function metal that effectuates an n-type threshold voltage shift. "N-type threshold voltage shift" as used herein means a shift in the Fermi energy of an n-type semiconductor device towards a conduction band of silicon in a silicon-containing material of the n-type semiconductor device. The "conduction band" is the lowest lying electron energy band of the doped material that is not completely filled with electrons. In one embodiment, the work function of the n-type work function metal ranges from 4.1 eV to 4.3 eV.

In one embodiment, the n-type work function metal is composed of at least one of titanium aluminum, titanium aluminum carbide, tantalum nitride, titanium nitride, hafnium nitride, hafnium silicon, or combinations and thereof. The n-type work function metal can be a single material layer or a multi-material layer.

In some embodiments, and when the gate structure is present in a pFET device region, the gate structure is a pFET gate structure and the work function metal 24 is a p-type work function metal that effectuates a p-type threshold voltage shift. In one embodiment, the work function of the p-type work function metal ranges from 4.9 eV to 5.2 eV. As used herein, "threshold voltage" is the lowest attainable gate voltage that will turn on a semiconductor device, e.g., transistor, by making the channel of the device conductive. The term "p-type threshold voltage shift" as used herein means a shift in the Fermi energy of a p-type semiconductor device towards a valence band of silicon in the silicon containing material of the p-type semiconductor device. A "valence band" is the highest range of electron energies where electrons are normally present at absolute zero.

In one embodiment, the p-type work function metal can be composed of titanium and its nitride or carbide. In one specific embodiment, the p-type work function metal is composed of titanium nitride. The p-type work function metal can also be composed of titanium aluminum nitride, tantalum nitride, ruthenium, platinum, molybdenum, cobalt, and alloys and combinations or thereof. The p-type work function metal can be a single material layer or a multi-material layer.

The work function metal 24 can be formed utilizing a deposition process such as, for example, chemical vapor deposition (CVD), plasma enhanced chemical vapor deposition (PECVD), physical vapor deposition (PVD), sputtering, or atomic layer deposition (ALD). In one embodiment, the work function metal 24 can have a thickness in a range from 1 nm to 10 nm. Other thicknesses that are lesser than, or greater than, the aforementioned thickness range can also be employed for each of work function metal 24.

The gate structure (22, 24) can be formed utilizing techniques well-known to those skilled in the art. In one embodiment, the gate structure can be formed by first forming a continuous layer of the high-k gate dielectric material 22 on the entire structure shown in FIG. 2. After forming the continuous layer of the high-k gate dielectric material 22, the work function metal 24 can be formed. After forming the work function metal 24, the work function metal 24 can be recessed to physically expose a portion of the continuous layer of the high-k gate dielectric material 22. An etch is then used to remove the physically exposed portion of the continuous layer of the high-k gate dielectric material 22 such that an upper portion of each vertical semiconductor material structure 12 is physically exposed.

At this point of the present application, the passivation liner 26 is formed. The passivation liner 26 can be formed by depositing a continuous layer of passivation material and then removing the passivation material from atop each dielectric hard mask cap 14. The passivation material that provides the passivation liner 26 includes a dielectric material that is compositionally the same as the bottom sacrificial spacer 20, yet compositionally different from each dielectric hard mask cap 14. In one embodiment, the passivation material that provides the passivation liner 26 (and the dielectric hard mask caps 14) can be composed of silicon nitride. The deposition of the continuous layer of passivation material can include any well-known deposition process such as, for example, chemical vapor deposition (CVD), plasma enhanced chemical vapor deposition (PECVD), physical vapor deposition (PVD), sputtering, or atomic layer deposition (ALD). In one embodiment of the present application, the continuous layer of passivation material can have a thickness in a range from 10 nm to 25 nm. Other thicknesses that are lesser than, or greater than, the aforementioned thickness range can also be employed for continuous layer of passivation material. The continuous layer of passivation material typically has a conformal thickness. The removal of the passivation material from atop each dielectric hard mask cap 14 can be performed utilizing a planarization process such as, for example, chemical mechanical polishing (CMP).

As mentioned above, the passivation liner 26 encapsulates the gate structure (22, 24). The passivation liner 26 is also located on an upper portion of each dielectric hard mask capped vertical semiconductor material structure (12/14) and on physically exposed surfaces of the bottom sacrificial spacer 20. The passivation liner 26 has a topmost surface that is typically coplanar with a topmost surface of each dielectric hard mask cap 14.

Figure 4:
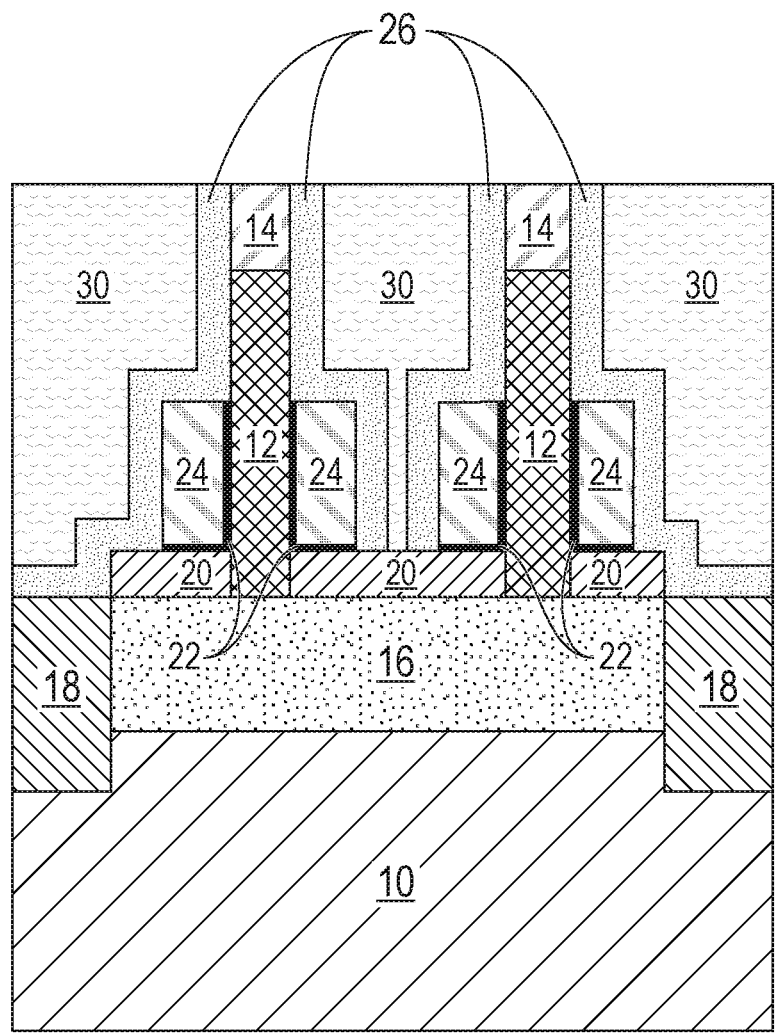
FIG. 4 is a cross sectional view of the exemplary semiconductor structure of FIG. 3 after forming a lower interlayer dielectric (ILD) material laterally surrounding the vertical semiconductor material structure and the gate structure and adjacent to the passivation liner.

Referring now to FIG. 4, there is illustrated the exemplary semiconductor structure of FIG. 3 after forming a lower interlayer dielectric (ILD) material 30 laterally surrounding the vertical semiconductor material structure 12 and the gate structure (22, 24) and adjacent to the passivation liner 26.

The lower ILD material 30 is composed of a dielectric material which differs in composition from the passivation liner 26. The lower ILD material 30 may be composed of, for example, silicon dioxide, undoped silicate glass (USG), fluorosilicate glass (FSG), borophosphosilicate glass (BPSG), a spin-on low k dielectric layer, a chemical vapor deposition (CVD) low-k dielectric layer or any combination thereof. In another embodiment, a self-planarizing material such as a spin-on glass (SOG) or a spin-on low-k dielectric material such as SiLK™ can be used as the lower ILD material 30; the term "low-k" denotes a dielectric material having a dielectric constant of less than 4.0. In one embodiment, lower ILD material 30 can be formed utilizing a deposition process including, for example, chemical vapor deposition (CVD), plasma enhanced chemical vapor deposition (PECVD), evaporation or spin-on coating. Following deposition of lower ILD material 30, a planarization process such as, for example, chemical mechanical polishing (CMP), can employed. As is shown, the lower ILD material 30 has a topmost surface that is coplanar with a topmost surface of the passivation liner 26 and each dielectric hard mask cap 14.

Figure 5:
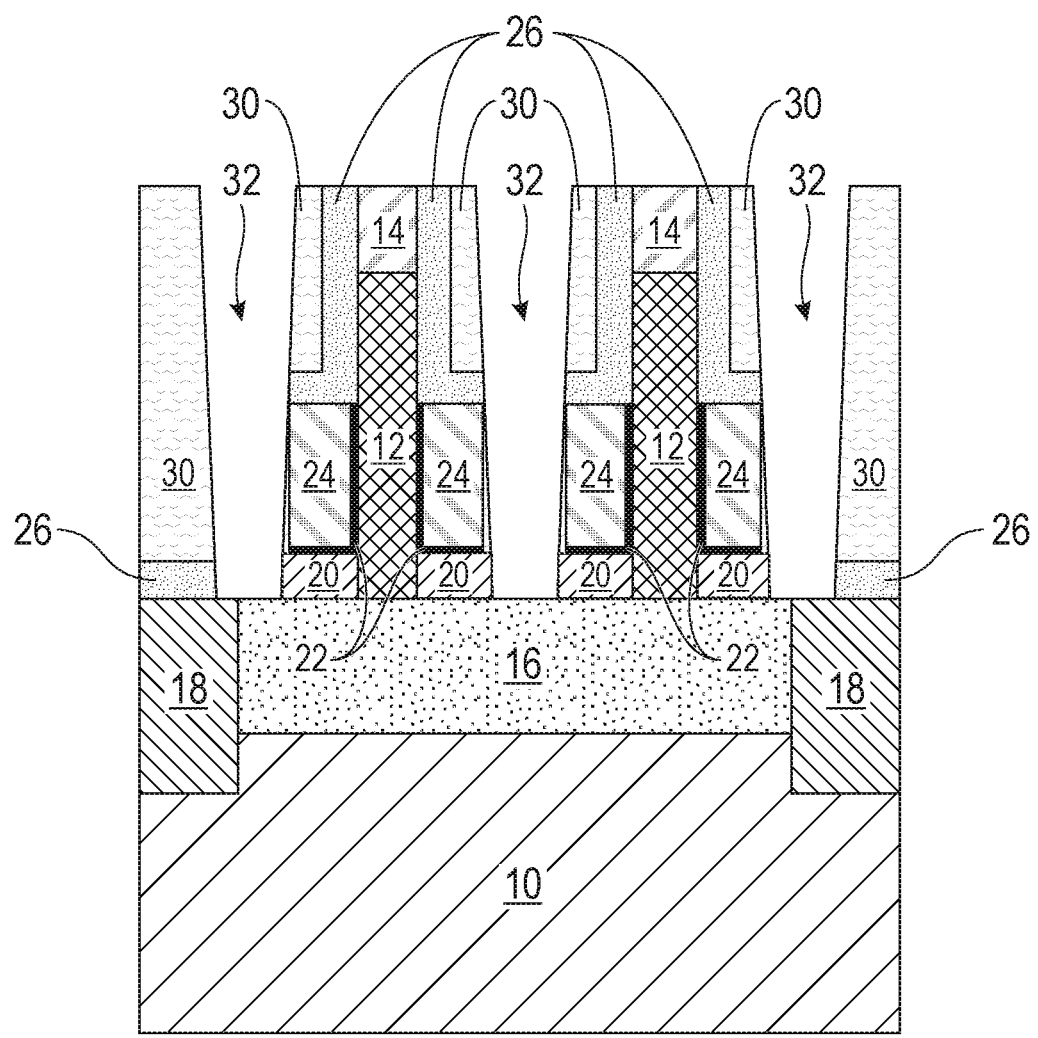
FIG. 5 is a cross sectional view of the exemplary semiconductor structure of FIG. 4 after forming openings into the lower ILD material that access the passivation liner and the bottom sacrificial spacer.

Referring now to FIG. 5, there is illustrated the exemplary semiconductor structure of FIG. 4 after forming openings 32 into the lower ILD material 30 that access the passivation liner 26 and the bottom sacrificial spacer 20. Each opening 32 that is formed physically exposes a surface of the bottom S/D structure 16 and a surface of the passivation liner 26. Each opening 32 is thus formed entirely through each of the lower ILD material 30, the passivation liner 26, and the bottom sacrificial spacer 20. A portion of the passivation liner 26 remains above the gate structure (22, 24) and a portion of the bottom sacrificial spacer 20 remains beneath the gate structure (22, 24). The opening 32 can be formed by lithography and etching. The etching can include one or more anisotropic etching processes. The openings 32 may have vertical sidewalls or the openings 32 may have tapered sidewalls.

Figure 6:
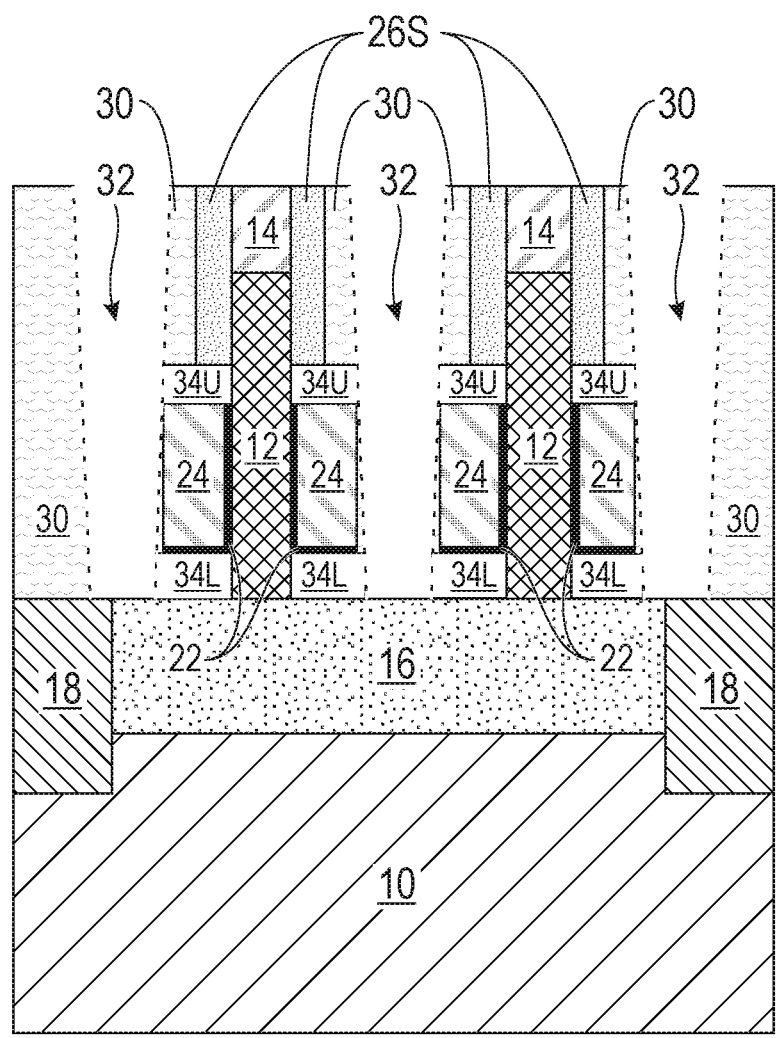
FIG. 6 is a cross sectional view of the exemplary semiconductor structure of FIG. 5 after removing the bottom sacrificial spacer and the passivation liner that are physically exposed by the openings to provide a bottom airgap opening, and a top airgap opening, respectively.

Referring now to FIG. 6, there is illustrated the exemplary semiconductor structure of FIG. 5 after removing the bottom sacrificial spacer 20 and the passivation liner 26 that are physically exposed by the openings 32 to provide a bottom airgap opening 34L, and a top airgap opening 34U, respectively; only a bottom portion of passivation liner 26 is removed. The removal of the bottom sacrificial spacer 20 and the passivation liner 26 includes a lateral etching process that is selective in remove the dielectric material that provides both the bottom sacrificial spacer 20 and the passivation liner 26. The lateral etching process is performed inside each opening 32. In one embodiment, and when the bottom sacrificial spacer 20 and the passivation liner 26 are both composed of silicon nitride, the lateral etching process includes using phosphoric acid as an etchant.

The bottom airgap opening 34L is located beneath the gate structure (22, 24) and physically exposes a lower portion of the sidewall of each vertical semiconductor material structure 12. The top airgap opening 34U is located above the gate structure (22, 24) and physically exposes an upper portion of the sidewall of each vertical semiconductor material structure 12. As is shown, a portion of the passivation liner 26 is located on an upper portion of a sidewall of the vertical semiconductor material structure 12 and a sidewall of the dielectric hard mask cap 14. Each remaining portion of the passivation liner 26 can be referred to as a vertical passivation material spacer 26S.

Figure 7:
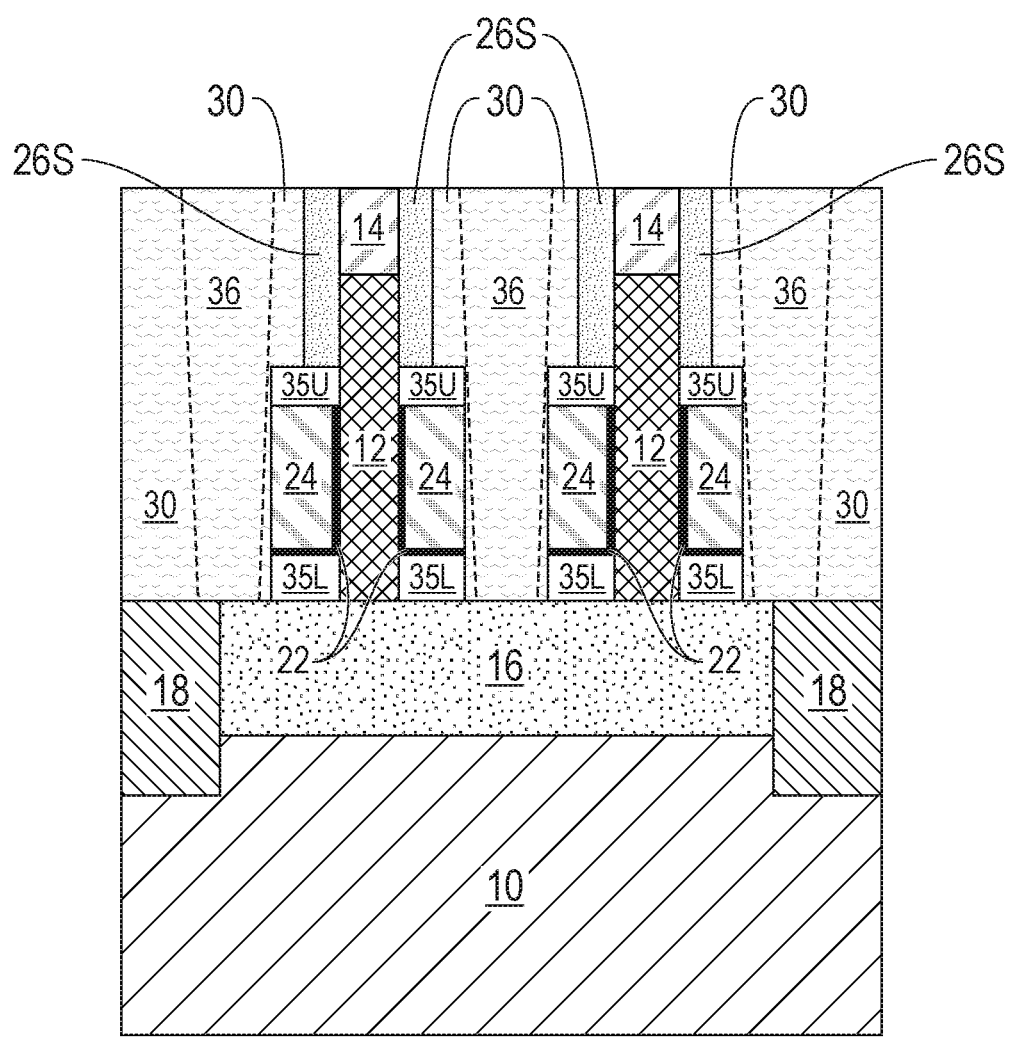
FIG. 7 is a cross sectional view of the exemplary semiconductor structure of FIG. 6 after filling each opening with a dielectric fill material which seals the bottom airgap opening and the top airgap opening providing a bottom airgap spacer, and a top airgap spacer, respectively.

Referring now to FIG. 7, there is illustrated the exemplary semiconductor structure of FIG. 6 after filling each opening 32 with a dielectric fill material 36 which seals the bottom airgap opening 34L and the top airgap opening 34U providing a bottom airgap spacer 35L, and a top airgap spacer 35U, respectively. The dielectric fill material 36 can include one of the dielectric materials mentioned above for the lower ILD material 30. In some embodiments, the dielectric fill material 36 is composed of a compositionally same dielectric material as the lower ILD material 30. In such an embodiment, no material interface would be present between the dielectric fill material 36 and the lower ILD material 30. In other embodiments, the dielectric fill material 36 is composed of a compositionally different dielectric material than the lower ILD material 30. In such an embodiment, a material interface would be present between the dielectric fill material 36 and the lower ILD material 30. In FIG. 7, dotted lines denote the located of possible material interfaces between the dielectric fill material 36 and the lower ILD material 30. Collectively, the dielectric fill material 36 and the lower ILD material 30 may be referred to as lower ILD material layer 37 (See, FIG. 8). As is shown, the lower ILD material layer 37 is located laterally adjacent the least one vertical semiconductor material structure 12, and the lower ILD material layer 27 has a topmost surface that is located above the topmost surface of each of the vertical semiconductor material structures 12.

The dielectric fill material 36 can be formed by utilizing one of the deposition processes mentioned for forming the lower ILD material 30. A planarization process may follow the deposition of the dielectric fill material 36.

The bottom airgap spacer 35L is located beneath the gate structure (22, 24) and contacts a lower portion of the sidewall of each vertical semiconductor material structure 12. The top airgap spacer 35U is located above the gate structure (22, 24) and contacts an upper portion of the sidewall of each vertical semiconductor material structure 12. In some embodiments, and as shown in FIG. 7, the bottom airgap spacer 35L and the top airgap spacer 35U have a lateral width that is equal to a lateral width of the gate structure (22, 24). The vertical passivation material spacer 26S has a lateral width that is less than the lateral width of the bottom airgap spacer 35L, the top airgap spacer 35U and the gate structure (22, 24).

Figure 8:
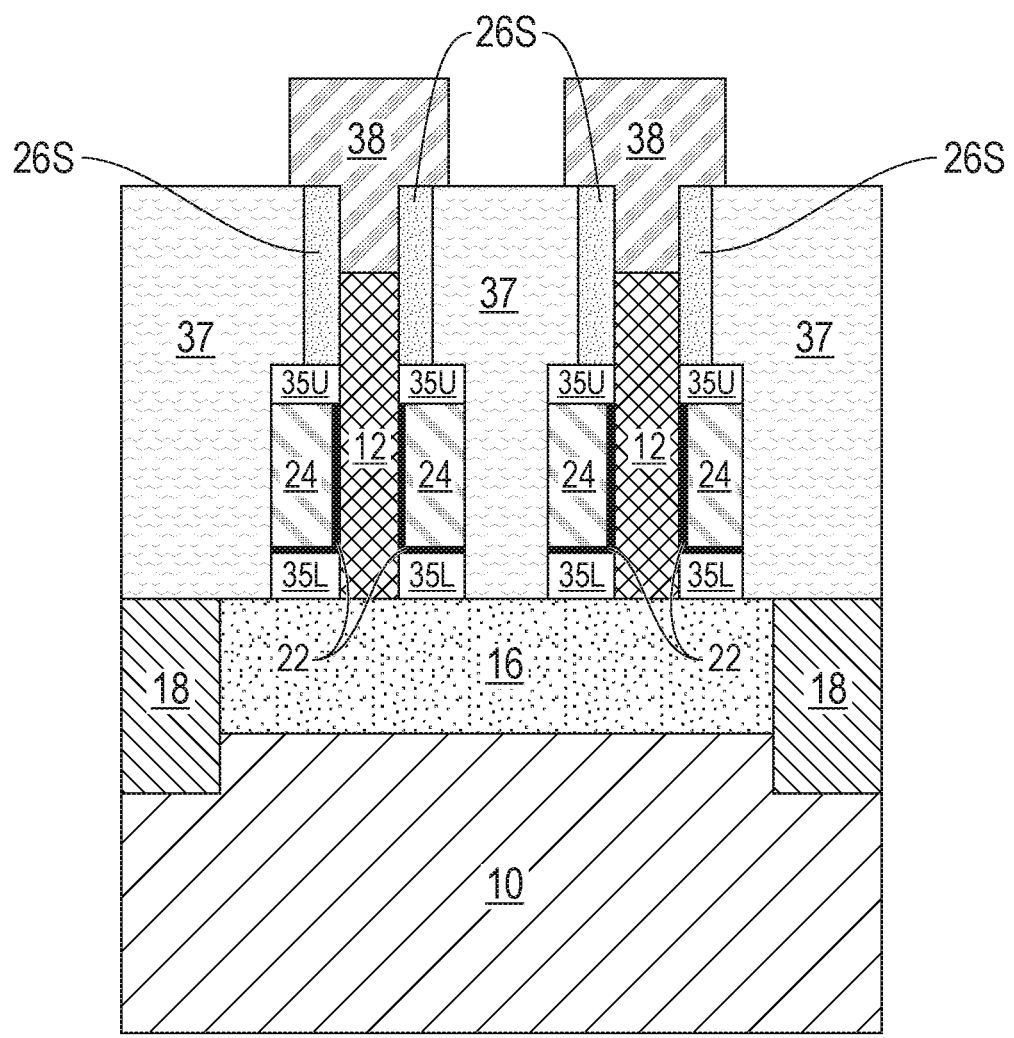
FIG. 8 is a cross sectional view of the exemplary semiconductor structure of FIG. 7 after removing the dielectric hard mask cap and forming a top S/D structure contacting the topmost surface of the vertical semiconductor material structure.

Referring now to FIG. 8, there is illustrated the exemplary semiconductor structure of FIG. 7 after removing the dielectric hard mask cap 14 from each vertical semiconductor material structure 12, and forming a top S/D structure 38 contacting a topmost surface of the vertical semiconductor material structure 12.

The removal of the dielectric hard mask cap 14 can include any material removal process that is selective in removing the dielectric hard mask cap 14 from the vertical semiconductor material structures 12. In one example, the dielectric hard mask cap 14 can be removed utilizing a planarization process such as, for example, chemical mechanical polishing (CMP). The removal of the dielectric hard mask cap 14 physically exposes a topmost surface of the underlying vertical semiconductor material structure 12.

The top S/D structure 38 includes a semiconductor material (as defined above) and an n-type dopant (as also defined above) or a p-type dopant (as also defined above). In some embodiments, and when present in an nFET device region, the top S/D structure 38 may be a top nFET S/D structure composed of a semiconductor material as defined above and an n-type dopant as defined above. In other embodiments, and when present in a pFET device region, the top S/D structure 38 may be a top pFET S/D structure composed of a semiconductor material as defined above and a p-type dopant as defined above.

The semiconductor material that provides the top S/D structure 38 can be compositionally the same as, or compositionally different from, the semiconductor material that provides the bottom S/D structure 16 and/or the vertical semiconductor material structure 12. The concentration of dopant within the semiconductor material that provides the top S/D structure 38 can range from $1 \times 10^{18}$ atoms/cm$^3$ to $1 \times 10^{21}$ atoms/cm$^3$, although dopant concentrations greater than $1 \times 10^{21}$ atoms/cm$^3$ or less than $1 \times 10^{18}$ atoms/cm$^3$ are also conceived. The top S/D structure 38 can have a non-faceted surface or a faceted surface. In one embodiment and as shown in the drawings, the top S/D structure 38 has a lower portion of a first width and an upper portion of a second width that is greater than the first width. As is shown, the vertical passivation material spacer 26S which is located above the top airgap spacer 35U, contacts the upper portion of the sidewall of the vertical semiconductor material structure 12 and a sidewall of the top S/D structure 38.

The top S/D structure 38 can be formed utilizing an epitaxial growth (or deposition) process, as defined above. A laser drive-in anneal is performed after the epitaxial growth process; a laser drive-in anneal prevents excess diffusion of dopants at the bottom S/D structure 16. The dopants within the top S/D structure 38 are typically introduced during the epitaxial growth process.

Figure 9:
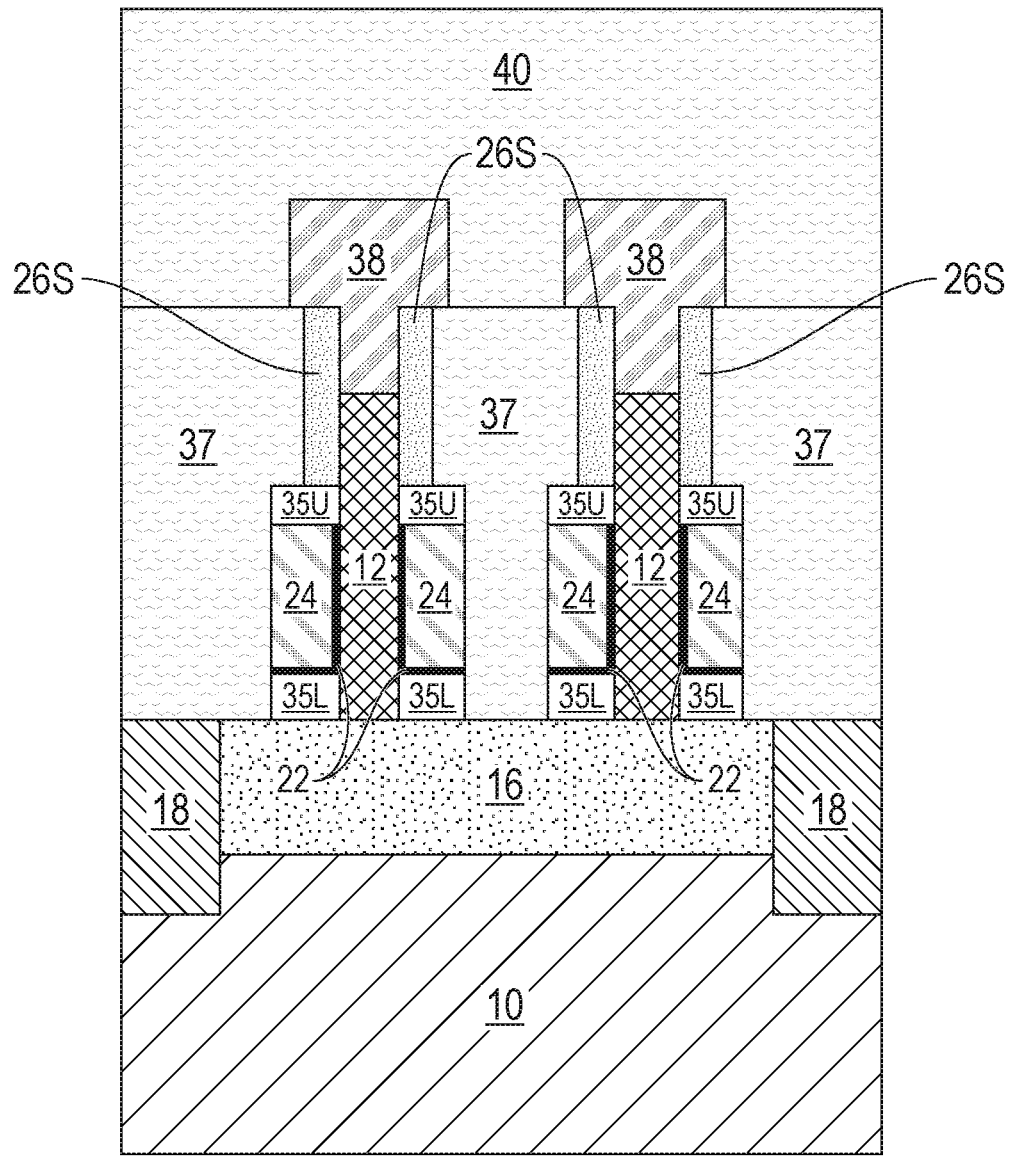
FIG. 9 is a cross sectional view of the exemplary semiconductor structure of FIG. 8 after forming an upper ILD material layer.

Referring now to FIG. 9, there is illustrated the exemplary semiconductor structure of FIG. 8 after forming an upper ILD material layer 40. The upper ILD material layer 40 may include one of the dielectric materials mentioned above for the lower ILD material 30. In some embodiments, the upper ILD material layer 40 is composed of a compositionally same dielectric material as lower ILD material 30. In such an embodiment, no material interface would be present between the upper ILD material layer 40 and the lower ILD material 30. In other embodiments, the upper ILD material layer 40 is composed of a compositionally different dielectric material than the lower ILD material 30. In such an embodiment, a material interface would be present between the upper ILD material layer 40 and the lower ILD material 30. The upper ILD material layer 40 can be formed by utilizing one of the deposition processes mentioned for forming the lower ILD material 30. A planarization process may follow the deposition of the upper ILD material layer 40. The upper ILD material layer 40 embeds an upper portion of the top S/D structure 38.

FIG. 9 illustrates a semiconductor structure (i.e., VFET) in accordance with the present application. The VFET includes at least one vertical semiconductor material structure 12 having a bottommost surface contacting a surface of a bottom source/drain structure 16 a topmost surface contacting a surface of a top source/drain structure 38. A gate structure (22, 24) is located laterally adjacent to a sidewall of the at least one vertical semiconductor material structure 12. A bottom airgap spacer 35L is located between the gate structure (22, 24) and the bottom source/drain structure 16 and contacts a lower portion of the sidewall of the at least one vertical semiconductor material structure 12. A top airgap spacer 35U is located above the gate structure (22, 24) and contacts an upper portion of the sidewall of the at least one vertical semiconductor material structure 12.

The top airgap spacer 35U reduces overlap capacitance between the gate structure (22, 24) and the top source/drain structure 38 of the VFET, while the bottom airgap spacer 35L reduces the overlap capacitance and a coupling capacitance that is present between the gate structure (22, 24) and the bottom source/drain structure 16 of the VFET.

Figure 10:
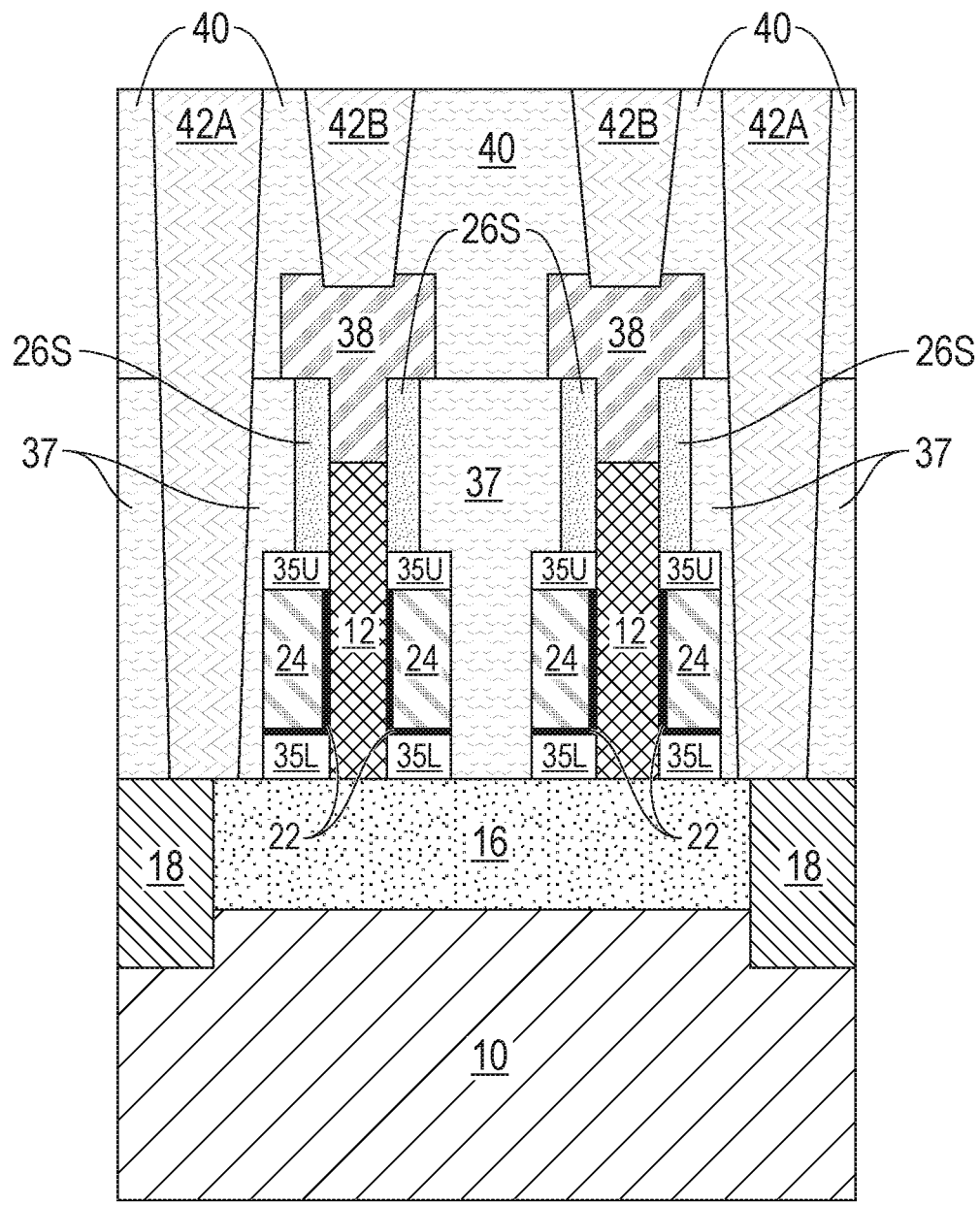
FIG. 10 is a cross sectional view of the exemplary semiconductor structure of FIG. 9 after forming a bottom contact structure and a top contact structure.

Referring now to FIG. 10, there is illustrated the exemplary semiconductor structure of FIG. 9 after forming a bottom contact structure 42A and a top contact structure 42B. The bottom contact structure 42A contacts a surface of the bottom S/D structure 16, while the top contact structure 42B contacts a surface of the top S/D structure 38. The contact structures (42A, 42B) can be formed by first providing contact openings into the ILD material layers (40, 37). The contact openings can be formed by lithography and etching. A contact metal such as, for example, copper, aluminum, tungsten, cobalt, or alloys thereof is then formed into each contact opening utilizing a deposition process. A planarization process can follow the deposition process. The contact metal or metal alloy within each contact opening is referred to herein as a contact structure 42A, 42B. As shown in FIG. 10, the contact structures 42A, 42B a topmost surface that is coplanar with a topmost surface of the upper ILD material layer 40.

While the present application has been particularly shown and described with respect to preferred embodiments thereof, it will be understood by those skilled in the art that the foregoing and other changes in forms and details may be made without departing from the spirit and scope of the present application. It is therefore intended that the present application not be limited to the exact forms and details described and illustrated, but fall within the scope of the appended claims.

What is claimed is:

1. A semiconductor structure comprising:
   at least one vertical semiconductor material structure having a bottommost surface contacting a surface of a bottom source/drain structure and a topmost surface contacting a surface of a top source/drain structure;
   a gate structure located laterally adjacent to a sidewall of the at least one vertical semiconductor material structure;
   a bottom airgap spacer located between the gate structure and the bottom source/drain structure and contacting a lower portion of the sidewall of the at least one vertical semiconductor material structure; and a top airgap spacer located above the gate structure and contacting an upper portion of the sidewall of the at least one vertical semiconductor material structure, wherein the bottom airgap spacer and the top airgap spacer have a lateral width that is equal to a lateral width of the gate structure.

2. The semiconductor structure of claim 1, wherein the gate structure is an nFET gate structure comprising a high-k gate dielectric material and an n-type work function metal.

3. The semiconductor structure of claim 1, wherein the gate structure is a pFET gate structure comprising a high-k gate dielectric material and a p-type work function metal.

4. The semiconductor structure of claim 1, wherein the top source/drain structure has a lower portion that has a first width and an upper portion of a second width that is greater than the first width.

5. The semiconductor structure of claim 1, further comprising a vertical passivation material spacer located above the top airgap spacer and contacting the upper portion of the sidewall of the at least one at least one vertical semiconductor material structure and a sidewall of the top source/drain structure.

6. The semiconductor structure of claim 5, wherein the vertical passivation material spacer has a lateral width that is less than the lateral width of each of the bottom airgap spacer, the top airgap spacer, and the gate structure.

7. The semiconductor structure of claim 1, further comprising a lower interlayer dielectric material layer located laterally adjacent the least one vertical semiconductor material structure, wherein the lower interlayer dielectric material layer has a topmost surface that is located above the topmost surface of the at least one vertical semiconductor material structure.

8. The semiconductor structure of claim 7, further comprising an upper interlayer dielectric material layer located on the lower interlayer dielectric material layer, and embedding an upper portion of the top source/drain structure.

9. The semiconductor structure of claim 8, further comprising a bottom contact structure extending through both the upper and lower interlayer dielectric material layers and contacting the bottom source/drain structure, and a top contact structure extending through the upper interlayer dielectric material layer and contacting the top source/drain structure.

10. The semiconductor structure of claim 1, wherein the bottom airgap spacer reduces overlap capacitance and coupling capacitance between the gate structure and the bottom source/drain structure.

11. A semiconductor structure comprising:
at least one vertical semiconductor material structure having a bottommost surface contacting a surface of a bottom source/drain structure and a topmost surface contacting a surface of a top source/drain structure;
a gate structure located laterally adjacent to a sidewall of the at least one vertical semiconductor material structure;
a bottom airgap spacer located between the gate structure and the bottom source/drain structure and contacting a lower portion of the sidewall of the at least one vertical semiconductor material structure;
a top airgap spacer located above the gate structure and contacting an upper portion of the sidewall of the at least one vertical semiconductor material structure a lower interlayer dielectric material layer located laterally adjacent the least one vertical semiconductor material structure
an upper interlayer dielectric material layer located on the lower interlayer dielectric material layer, and embedding an upper portion of the top source/drain structure; and
a bottom contact structure extending through both the upper and lower interlayer dielectric material layers and contacting the bottom source/drain structure, and a top contact structure extending through the upper nterlayer dielectric material layer and contacting the top source/drain structure.

* * * * *